United States Patent [19]
Richter et al.

[11] Patent Number: 5,458,735
[45] Date of Patent: Oct. 17, 1995

[54] PROCESS FOR THE PRODUCTION OF ELECTROLUMINESCENT SILICON STRUCTURES

[75] Inventors: Axel Richter, München; Peter Steiner, Schrobenhausen; Walter Lang, München, all of Germany

[73] Assignee: Fraunhofer-Gesellschaft zur Förderung der Angewandten Forschung e.V., München, Germany

[21] Appl. No.: 193,085

[22] PCT Filed: Jul. 20, 1992

[86] PCT No.: PCT/DE92/00598

§ 371 Date: Feb. 7, 1994

§ 102(e) Date: Feb. 7, 1994

[87] PCT Pub. No.: WO93/04503

PCT Pub. Date: Mar. 4, 1993

[30] Foreign Application Priority Data

Aug. 14, 1991 [DE] Germany .................. 41 26 955.1

[51] Int. Cl.⁶ .................................. H01L 21/3063
[52] U.S. Cl. .................. 156/662.1; 437/173; 437/187; 437/905; 204/129.3; 257/103
[58] Field of Search .................. 156/662; 204/129.3; 257/103; 437/170, 173, 181, 187, 947, 905; 148/D92

[56] References Cited

U.S. PATENT DOCUMENTS

| | | | |
|---|---|---|---|
| 4,092,445 | 5/1978 | Tsuzuki | 427/85 |
| 4,684,964 | 8/1987 | Pankove | 357/17 |
| 4,884,112 | 11/1989 | Lorenzo | 357/17 |
| 5,206,523 | 4/1993 | Goesele et al. | 257/103 |
| 5,272,355 | 12/1993 | Namavar et al. | 257/103 |
| 5,285,078 | 2/1994 | Mimura et al. | 257/103 |
| 5,301,204 | 4/1994 | Cho et al. | 372/69 |
| 5,324,965 | 6/1994 | Tompsett et al. | 257/103 |
| 5,331,180 | 7/1994 | Yamada et al. | 257/103 |
| 5,348,618 | 9/1994 | Canham et al. | 156/662 |
| 5,348,627 | 9/1994 | Propst et al. | 204/129.3 |

FOREIGN PATENT DOCUMENTS

| | | | |
|---|---|---|---|
| 52-70782 | 6/1977 | Japan | H01L 33/00 |
| 60-0058680 | 3/1985 | Japan | H01L 21/76 |
| 61-179581 | 12/1986 | Japan | H01L 33/00 |

OTHER PUBLICATIONS

Koshida, Nobuyoshi and Koyama, Hideki, "Visible electroluminescence from porous silicon", Appl. Phys. Lett., 60(3), Jan. 20, 1992, pp. 347–349.

V. Lehman and U. Gösele, "Porous Silicon Formation: A Quantum Wire Effect", Appl. Phys. Lett. 58(8), Feb. 25, 1991, pp. 856–858.

P. Steiner et al. "Blue and Green Electroluminescence from a Porous Silicon Device", IEEE Electron Device Letters, 14(7), Jul. 1993, pp. 317–318.

A. Halimouili et al., "Electroluminescence in the visible range during anodic oxidation of porous silicon", App. Phys. Lett., 59(3), Jul. 1991, pp. 304–306.

Appl. Phys. Lett. 55(2), Jul. 10, 1989, P. L. Bradfiedl et al., "Electroluminescence from sulfur impurities in a p–n junction formed in epitaxial silicon" pp. 100–102.

(List continued on next page.)

Primary Examiner—George Fourson
Assistant Examiner—Thomas G. Bilodeau
Attorney, Agent, or Firm—Ralph H. Dougherty; Scott E. Hanf

[57] ABSTRACT

A process for the production of electroluminescent silicon structures, including: placing a silicon wafer in an acid bath; anodizing the silicon wafer in the acid bath using the apparatus of FIG. 2; illuminating the anode side of the silicon wafer during at least part of the time the silicon wafer is being placed in the acid bath and is being anodized; causing at least some areas of the monocrystalline silicon of the silicon wafer to be converted into a microporous silicon layer; and forming two contacts by means of which a voltage can be applied to the microporous silicon layer.

16 Claims, 2 Drawing Sheets

OTHER PUBLICATIONS

Appl. Phys. A53 (1989), A. Föll, "Properties of silicon–electrolyte junctions and their application to silicon characterization" pp. 8–19.

Electronics World and Wireless World, Nov. 1990, "Red light from warm silicon", p. 936.

Appl. Phys. Lett. 57(10), Sep. 3, 1990, L. T. Canham, "Silicon quantum wire array fabrication by electrochemical and chemical dissolution of wafers", pp. 1046–1048.

The Journal of the Electrochemical Society, vol. 126, No. 2, Feb. 1980, T. Unagami, "Formation mechanism of porous silicon layer by anodization in HF solution", pp. 476–483.

PROCESS FOR THE PRODUCTION OF ELECTROLUMINESCENT SILICON STRUCTURES

FIELD OF THE INVENTION

The present invention refers to a process for the production of electroluminescent silicon structures.

DESCRIPTION OF THE PRIOR ART

For a long time, it has been taken for granted that the only structures suitable for light emission are structures consisting of semiconductor materials which have direct band transition. As is generally known, the band gap of semiconductor material is the difference between the energy levels of the valence band and of the conduction band, which is filled with electrons. In semiconductor materials having a direct band transition, the highest energetic state in the valence band lies directly below the lowest energetic state of the conduction band. This has the effect that, when a direct transition of electrons into the valence band takes place, a recombination of these electrons with holes (positive charge carriers) will occur, whereby photons will be producer whose energy corresponds to the band gap of the semiconductor material.

Typical materials having such a direct band transition are e.g. GaAs compound semiconductors, and, consequently, such GaAs compound semiconductors are frequently used for producing light-emitting elements.

In contrast to GaAs, silicon is a semiconductor material having an indirect band transition. In such materials, the highest energetic state in the valence band is displaced relative to the lowest energetic state in the conduction band so that electrons cannot directly drop into the valence band. In order to achieve suitable energy levels, the electrons have to combine with holes as well as with phonons in such materials having an indirect band transition. The likelihood that this process takes place is, in view of the fact that three particles participate, very small.

Lately, it has been found out that, notwithstanding the fact that silicon is a semiconductor material having an indirect band transition, semiconductor structures consisting of silicon are suitable for photoluminescence provided that the silicon is anodized in an aqueous hydrofluoric acid bath so as to produce microporous silicon layers.

By way of example, reference is made to L. T. Canham, Appl. Phys. Lett. 57 (10), Sep. 3, 1990, pages 1046 to 1048. Within the microporous layers having pore sizes of less than 2 nm (20 Å), the electron movement is limited to one dimension, i.e. to a direction of movement along the so called "quantum conductors" or "quantum wires" which are defined between the pores. By limiting the possibilities of movement of the electrons, these quantum conductors effect a direct transition of the electrons between the conduction band and the valiance band. In other words, the band structure is purposefully influenced by means of a local limitation of the possibilities of movement of the electrons. As has, however, been explained by Canham in the cited publication (cf. page 1047F right column, last paragraph), the luminescence of silicon only occurs in the case of newly anodized silicon substrates. In other words, the attempt to maintain a stable photoluminescence of such silicon structures has not been successful up to now.

Also the publication "Silicon Lights Up", Scientific American, July 1991, pages 86 and 87, discloses that porous silicon structures, which are produced in an aqueous hydrofluoric acid making use of a silicon wafer, are adapted to be excited by means of light such that photoluminescence occurs.

Furthermore, reference is made to the fact that it was successfully attempted to electrically excite the luminescence in silicon structures; however, neither the nature of the structure nor the production process of said structure are disclosed.

The technical publication V. Lehmann, Appl. Phys. Lett. 58 (8), Feb. 25, 1991, pages 856 to 858, discloses that, in porous silicon layers, which are produced by means of anodization in an hydrofluoric acid electrolyte, two-dimensional quantum concentrations or quantum wires and quantum conductors, respectively, are produced, which cause a change in the energetic band gap of the microporous silicon structures in comparison with monocrystalline silicon.

The publication C. Pickering, J. Phys. C: Solid State Phys. 17 (1981), pages 6535 to 6552, deals with optical studies of porous silicon film structures, which have been produced by an anodization of silicon wafers in an aqueous solution of hydrofluoric acid. As has been explained on page 6537, second section, last paragraph, photoluminescence measurements have, however, been carried out only at very low temperatures of 4.2 K.

The publication of H. Föll, Appl. Phys. A 53, 1991, pages 8 to 19, deals with the properties of silicon-electrolyte junctions of silicon samples which are immersed in an aqueous hydrofluoric acid solution, and the formation of porous silicon layers is disclosed in this publication as well. Said publication is, however, not concerned with photoluminescent or electroluminescent silicon structures, but with the examination of the properties of the silicon-hydrofluoric acid junction. For this purpose, a universal electrochemical silicon analyzer is shown, in which the front of the wafer is illuminated with a laser beam having a wavelength of small penetration depth so as to define the diffusion length and the surface recombination rate on a silicon wafer. Minority carriers are thus generated close to the front surface. The resultant rear photocurrent is measured. It follows that this publication does not deal with luminescent properties of silicon.

U.S. Pat. No. 4,092,445 describes a process for the production of microporous silicon structures, said process comprising the steps of placing a silicon wafer in an acid bath, anodizing the silicon wafer in said acid bath, and illuminating the silicon wafer while said silicon wafer is being placed in the acid bath and is being anodized, thus causing at least some areas of the mono-crystalline silicon of the silicon wafer to be converted into a microporous silicon layer.

OBJECT OF THE INVENTION

It is the object of the present invention to provide a process for the production of electroluminescent silicon structures.

SUMMARY OF THE INVENTION

This object is achieved by the following process steps:
placing a silicon wafer in an acid bath;
anodizing the silicon wafer in said acid bath;
illuminating the anode side of said silicon wafer during at least part of the time the silicon wafer is in the acid bath and being anodized, thus causing at least some areas of the monocrystalline silicon of the silicon wafer to be converted into a microporous silicon layer; and forming a first and a second contact by means of which a voltage can be applied to the microporous silicon layer.

The present invention is based on the finding that the process for the production of electroluminescent silicon structures, which is known from the prior art and which includes the steps of placing a silicon wafer in an acid bath and anodizing it in said bath so as to produce a microporous silicon layer, can be adapted and modified for the production of electroluminescent silicon structures by illuminating the anode side of the silicon wafer during at least part of the time said silicon wafer is placed in the acid bath and being anodized, whereupon two contacts are formed by means of which a voltage can be applied to the microporous silicon layer.

Making reference to the appended figures, the production process according to the present invention, a device suitable for carrying out said production process as well as an electroluminescent silicon structure produced in accordance with the production process according to the present invention are explained in detail hereinbelow.

DESCRIPTION OF PREFERRED EMBODIMENTS OF THE INVENTION

Making reference to FIG. 1, the structure of an electro luminescent silicon component, which has been manufactured in accordance with the production process according to the present invention, will be explained before the sequence of process steps is described.

Figure 1:
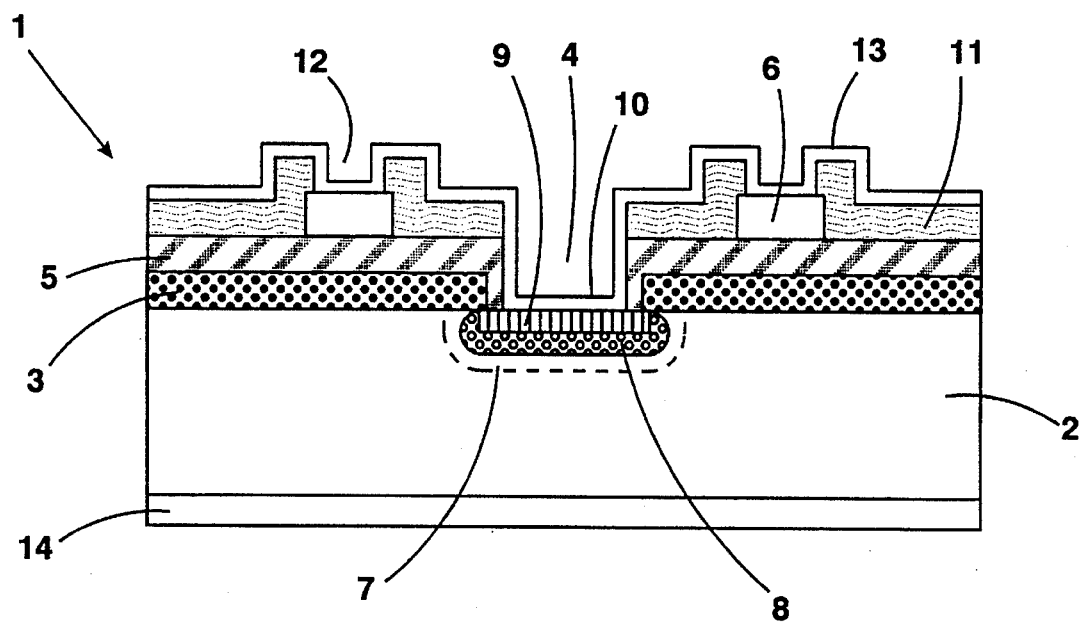
FIG. 1 shows a cross-sectional representation of an electroluminescent silicon structure produced in accordance with the production process according to the present invention.

The silicon component, as shown in FIG. 1 and which is designated generally by reference numeral 1, is obtained by separation of a plurality of identical silicon components formed on a common silicon wafer.

The silicon component 1 comprises a p-type substrate 2 having arranged thereon an oxide layer 3 with a central recess 4, which, in turn, is covered by a nitride layer 5. Nitride layer 5 has provided thereon a metallic coating 6 in the form of a chromium-gold alloy extending e.g. annularly round the recess 4. Below said recess 4, the p-type substrate 2 is followed by a p+ doping region 7 enclosing in a troughlike manner an n+ doping region, which is located directly below the recess 4, so as to form a p–n junction 9. The silicon within the n+ doping region 8 as well as within part of the p+ doping region 7 is a microporous silicon layer 10.

In other words, the p–n junction 9 lies within the microporous silicon layer 10. An additional nitride layer 11 covers the front of the component 1 with the exception of the recess 4 in the area of the microporous silicon layer 10 and an additional recess 12 in the area of the metallic coating 6.

The front of the silicon component 1 is covered throughout the whole area thereof with a transparent or at least partially light-transmitting first electrode 13, which can be formed e.g. by a gold contact layer having a thickness of 120 nm or by an indium tin oxide layer having a thickness of approx. 200 nm.

The back of the p-type substrate 2 is provided with a second electrode 14 in the form of an ohmic contact.

The production process of this silicon component 1 comprises the following process steps: a silicon wafer has applied thereto the silicon oxide layer 2 which serves as an implantation mask, said silicon oxide layer 2 being applied e.g. by thermal oxidation. The doping of the silicon wafer is preferably chosen such that the resistivity thereof is between 1 and 10 Ohm cm. Subsequently, the silicon oxide layer 2 is structured by known photolithographic measures. Using this implantation mask, a first doping step is now carried out for p+-doping the lower doping region, whereupon n+-doping of a doping region located above the lower doping region is effected with reduced implantation energy, a drive-in diffusion process being then carried out for driving in the dopants. This step is followed by full-area deposition of the nitride layer 5, which has then applied thereto a chromium-gold metallic coating 6 throughout the whole area thereof; this chromium-gold metallic coating 6 is then structured using measures which are known and which are taken for producing the annularly extending contact zone 6. Now, full-area deposition of the additional nitride layer 11 is carried out, whereupon a photoresist (not shown) is applied and structured. After adequate photolithographic steps, the nitride layer 5, 11 is etched away in the area of the central recess 4 as well as in the area of the additional recess 12 above the metallic coating, whereupon the photoresist is removed.

The anodization region of the silicon wafer 20 can be delimited laterally by an acid-resistant masking layer, said acid-resistant masking layer being preferably light-proof.

A silicon wafer 20 comprising a plurality of the silicon components 1 structured by the process steps which have been explained hereinbefore are now further treated in a production device 21 used for carrying out the essential steps of the production process according to the present invention which will be explained hereinbelow.

The production device 21 includes a basin 22 which contains an acid bath 23 comprising 2 to 50 percent by weight of hydrofluoric acid, the residue being ethanol and water.

The acid bath 23 has provided therein an anode 24 as well as a cathode 25, which are arranged in opposite, spaced relationship.

A holding device 26 has, at its periphery, a structural design of such a nature that it is in sealing contact with the walls of the basin 22 filled with acid, when it has been inserted into said basin 22 from above. The holding device 26 is provided with a central recess 27, the silicon wafer 20 being held at the location of said recess 27 in such a way that the edge portions thereof are sealingly enclosed.

Hence, the holding device is arranged in such a way that a flow of current between the anode 24 and the cathode 25 must pass through the silicon wafer 20 vertically to the main surfaces thereof.

An illumination device 28 in the form of a mercury lamp or a halogen lamp is arranged above the acid bath 23, or, in cases in which an acid-resistant illumination device 28 is used, within the acid bath 23, in such a way that the silicon wafer 20 is illuminated from its anode side. If the illumination device 28 is arranged outside of the basin 22 filled with acid, said basin 22 is preferably provided with a window (not shown) which allows a passage of light. In addition, when the illumination device 28 is arranged above the basin 22 filled with acid, a mirror can be provided in the acid bath 23, said mirror being used for deflecting the rays towards the wafer.

The illumination device can also be a laser. The laser which is preferably used in this case is an argon-ion laser having a wavelength of 488 nm and a power density per unit area of 5 W/cm2.

In this case, it is possible to provide selectively luminescent areas by selective anodizing.

Figure 2:
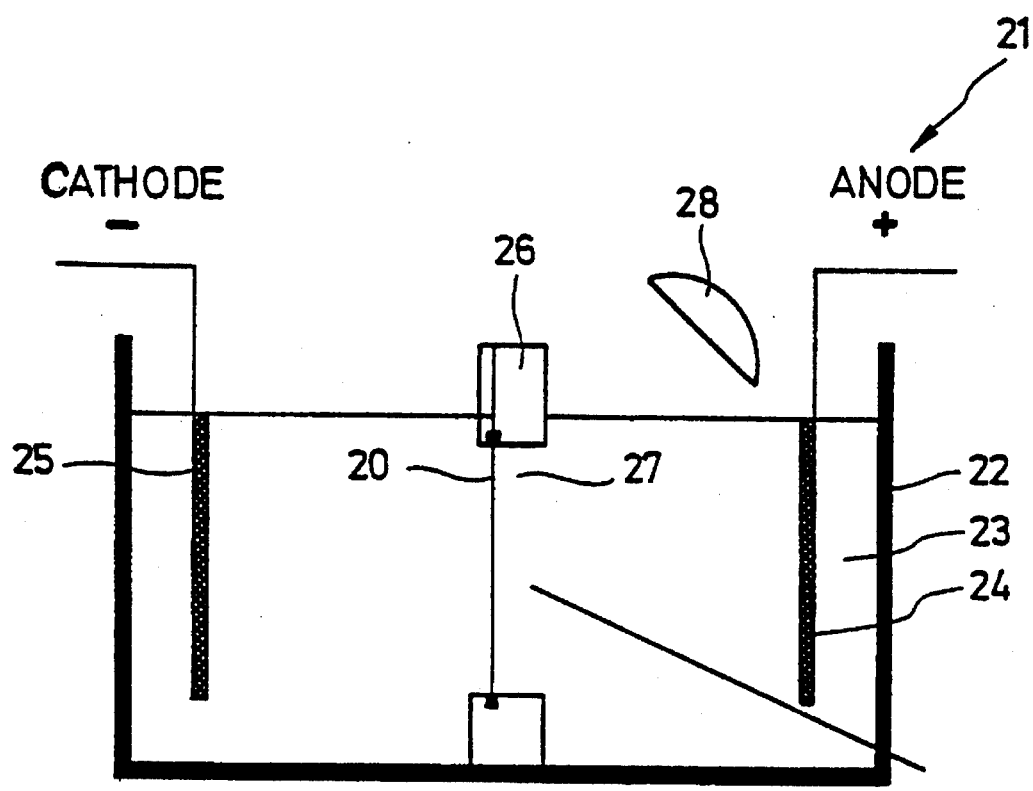
FIG. 2 shows a device for carrying out essential steps of the production process according to the present invention.

The continued production process-of the silicon components 1 within the silicon wafer 20, which have been produced by the process steps described at the beginning, will now be explained in detail again with reference to FIG. 2.

When the silicon wafer 20 has been inserted in the holding device 26, said holding device is introduced into the basin 22 from above. Now the silicon wafer is anodized with a current density of from 2 to 500 mA/cm2 by applying an adequate direct current to the anode 24 and the cathode 25; in the course of this process, the silicon wafer 20 is subjected to a conversion of the monocrystalline silicon into a microporous, electroluminescent silicon layer 10 in the area of the recesses 4 of the silicon components 1. The anodizing process in the acid bath as well as the illumination by means of the illumination device 28 are carried out for such a period of time that the microporous silicon layer 10 will extend into the substrate 2 up to a point beyond the p–n junction 9. Typical anodizing and illumination periods are between 10 seconds and 20 minutes.

After rinsing of the silicon component, said silicon component is provided with the ohmic contact 14 at the back as well as with the transparent electrode 13 at the front thereof. The electrode at the front can be realized by applying a gold contact having a thickness of 120 nm or by applying an indium tin oxide layer having a thickness of 200 nm.

When the silicon components 1 have been separated by means of an adequate division of the silicon wafer, the component is finished, with the exception of a housing which has to be provided.

In the preferred embodiment, the silicon component 1 produced in accordance with the process according to the present invention has a p–n junction within the porous silicon layer 10. Although such a p–n junction is regarded as being a preferred feature which serves the purpose of increasing the quantum efficiency, the p–n junction is not necessary for the fundamental operability of the component such that the n+ doping region 8 can be dispensed with.

It is also possible to use doping polarities which are opposite to those used in connection with the present embodiment.

Furthermore, it is not necessary that the second electrode 14 be formed as a rear ohmic contact at the back of the substrate 2. Any kind of contact making with the substrate 2, which may just as well be implemented at the front, is possible.

When the rear contact is omitted, it is also possible to form contacts in an interdigital structure on the microporous layer by means of the upper metallic coating.

What is claimed is:

1. A process for the production of electroluminescent silicon structures, comprising the following process steps:

placing a monocrystalline silicon wafer in an acid bath;

anodizing the silicon wafer in said acid bath;

illuminating the anode side of said silicon wafer during at least part of the time the silicon wafer is being placed in the acid bath and is being anodized, thus causing at least some areas of the monocrystalline silicon of the silicon wafer to be converted into a microporous silicon layer; and forming a first and a second contact by means of which a voltage can be applied to the microporous silicon layer.

2. A process according to claim 1, wherein the anodizing is carried out with a current density of from 2 to 500 mA/cm$^2$.

3. A process according to claim 1, wherein the acid bath comprises 2 to 50 percent by weight of hydrofluoric acid and that the residual thereof is ethanol and water.

4. A process according to claim 1, wherein the silicon wafer is n doped.

5. A process according to claim 4, wherein the doping of the silicon wafer is chosen such that the resistivity thereof is between 1 and 10 Ohm cm.

6. A process according to claim 1, wherein the illumination is effected by means of a mercury lamp or a halogen lamp or a laser.

7. A process according to claim 1, comprising the following initial process steps carried out before the silicon wafer is placed in the acid bath:

producing a silicon oxide layer which serves as an implantation mask;

structuring the silicon oxide layer;

implanting dopants with the same conductivity type as the silicon wafer;

driving in the dopants in a drive-in diffusion process;

depositing a nitride layer in a full-area deposition mode;

applying a chromium-gold metallic coating;

structuring the chromium-gold metallic coating;

depositing an additional nitride layer;

applying and structuring a photoresist;

etching away the nitride layer in a subsequently active area of the silicon wafer as well as in an area of the chromium-gold metallic coating; and removing the photoresist.

8. A process according to claim 1, further comprising an additional process step of additionally implanting dopants having a conductivity type opposite to the conductivity type of the silicon wafer so as to create a p–n junction in the subsequently porous silicon layer.

9. A process according to claim 1, wherein the process step of forming the second contact includes the forming of an ohmic contact at the side of the silicon wafer opposite the anode side.

10. A process according to claim 1, wherein the process step of forming the first contact includes the application of a gold contact.

11. A process according to claim 10, wherein the gold contact has a thickness of approximately 120 nm.

12. A process according to claim 1, wherein the process step of forming the first contact includes the application of an indium tin oxide layer.

13. A process according to claim 12, wherein the indium tin oxide layer has a thickness of approximately 200 nm.

14. A process according to claim 1, wherein the process step of forming the contacts comprises the following steps:

applying an at least partially light-transmitting first contact to the microporous silicon layer; and forming a second contact for establishing a contact with an area of the silicon wafer below the microporous silicon layer.

15. A process according to claim 1, wherein the anodization region of the silicon wafer is delimited laterally by an acid-resistant masking layer.

16. A process according to claim 15, wherein the acid-resistant masking layer is light-proof.

* * * * *